United States Patent
Oh et al.

(10) Patent No.: US 6,930,910 B2
(45) Date of Patent: Aug. 16, 2005

(54) MAGNETIC RANDOM ACCESS MEMORY CELL DEVICE USING MAGNETIC TUNNEL JUNCTION

(75) Inventors: Sang-Hyun Oh, Ichon-shi (KR); Kye-Nam Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 278 days.

(21) Appl. No.: 10/308,174

(22) Filed: Dec. 3, 2002

(65) Prior Publication Data

US 2003/0214836 A1 Nov. 20, 2003

(30) Foreign Application Priority Data

May 16, 2002 (KR) .......................................... 2002-27113

(51) Int. Cl.[7] .............................................. G11C 11/14
(52) U.S. Cl. ........................ 365/158; 365/171; 365/173
(58) Field of Search ................................ 365/158, 171, 365/173

(56) References Cited

U.S. PATENT DOCUMENTS

| | | | | |
|---|---|---|---|---|
| 5,894,447 A | * | 4/1999 | Takashima | .................. 365/158 |
| 6,140,672 A | | 10/2000 | Arita et al. | |
| 6,191,441 B1 | | 2/2001 | Aoki et al. | |
| 6,226,197 B1 | * | 5/2001 | Nishimura | .................. 365/171 |
| 6,236,605 B1 | | 5/2001 | Mori et al. | |
| 6,331,943 B1 | * | 12/2001 | Naji et al. | .................. 365/158 |
| 6,791,871 B2 | * | 9/2004 | Freitag et al. | .............. 365/158 |

FOREIGN PATENT DOCUMENTS

| | | | | |
|---|---|---|---|---|
| JP | 2000-132961 | 5/2000 | .......... | G11C/11/15 |
| JP | 2000-133784 | 5/2000 | .......... | H01L/27/10 |
| JP | 2000-187989 | 7/2000 | .......... | G11C/14/00 |

\* cited by examiner

*Primary Examiner*—Gene N. Auduong
(74) *Attorney, Agent, or Firm*—Mayer, Brown, Rowe & Maw LLP

(57) ABSTRACT

The present invention provides a magnetic random access memory (MRAM) cell device with a magnetic tunnel junction capable of obtaining a sufficient sense margins. To achieve this effect, the present invention provides a magnetic random access memory (MRAM) cell device, including: a word line; a bit line; a switching unit connected to the word line and the bit line; a magnetic tunnel junction unit connected to the bit line and the switching unit in parallel.

20 Claims, 3 Drawing Sheets

"D0"   "D1"

MAGNETIC RANDOM ACCESS MEMORY CELL DEVICE USING MAGNETIC TUNNEL JUNCTION

FIELD OF THE INVENTION

The present invention relates to an information recording technology using a ferromagnetic material; and, more particularly, to a magnetic random access memory (MRAM) cell device using a magnetic tunnel junction.

DESCRIPTION OF RELATED ARTS

Recently, a magnetic random access memory (hereinafter referred as to MRAM) device is a non-volatile memory cell suitable for a low power dissipation mode. Also, the MRAM device is considered as a third generation memory device because it is able to retrieve stored information even if power is turned off and advantageous of decreasing cell areas. Hence, the MRAM device is expected to be a substitute of a dynamic random access memory (DRAM) device, a static random access memory (SRAM) device and a flash memory device. Moreover, the MRAM device can be also implemented as a memory device for personal computers, large-scale computers, smart cards, notebooks, mobile telecommunication terminals, telecommunications, televisions and so forth.

The MRAM device employs a magnetic tunnel junction (hereinafter referred as to MTJ) wherein an insulating layer is placed in between a fixed magnetic layer and a freely switchable magnetic layer. The MRAM device stores information in states of 'D0' and 'D1', each representing a current difference of the MTJ occurring when inverting a magnetic moment of the freely switchable magnetic layer while fixing the magnetic moment of the fixed magnetic layer. This digital state can be constantly maintained unless an external magnetic field exceeding an anti-magnetic field of the freely switchable magnetic layer is exerted. Also, the MRAM device estimates a voltage of the MTJ in a state of flowing currents to the MTJ or flowing currents in a state of supplying a certain level of voltage so as to detect stored information without any deterioration.

To realize the MRAM device with use of the MTJ, it is necessary to address a cell. Among variously proposed typical MRAM devices, the most commonly used method is to use a switching device connected to the MTJ in series.

FIG. 1 shows a conventional MRAM device in accordance with a prior art. As shown in FIG. 1, a MTJ and a transistor M for selecting an assigned cell are connected in series. Particularly, the MTJ has a characteristic in that tunneling resistance of an electron changes when a pair of spins of magnetic materials on both end terminals of a dielectric body are parallel or anti-parallel in direction. Herein, the transistor M can use a diode as a switching device in addition to the transistor.

Meanwhile, a gate of the transistor M is also connected to a word line WL. One terminal of the MTJ is connected to a drain of the transistor M while the other terminal of the MTJ is connected to a bit line BL.

FIG. 2 is a cross-sectional view illustrating the MRAM cell of FIG. 1. A transistor including a gate electrode (hereinafter referred as to WL) layered with a gate oxide layer 13, a source S and a drain D is formed on a substrate 11 providing an isolation layer.

Afterwards, each of the source S and the drain D is connected to a first metal line M1 through a contact 15 passing through a first inter-layer insulating layer 14. A second metal line M2 is then connected to the first metal line M1, which is connected to the drain D, through a via 17 passing through a second inter-layer insulating layer 16 that covers the first metal line M1. In the mean time, the first metal line M1 connected to the source S is a ground terminal.

As the second metal line M2 is connected to the first metal line M1 through the via 17, the second metal line M2 is eventually connected to the drain D. Subsequently, a MTJ is formed on the second metal line M2, and a third inter-layer insulating layer 18 covers the MTJ and the second metal line M2.

On the third inter-layer insulating layer 18, the bit line BL is formed in a cross-direction to the word line WL. Thereafter, the bit line BL is connected to one terminal of the MTJ. Herein, the second metal line M2 is connected to the other end terminal of the MTJ.

Referring to FIGS. 1 and 2, once a voltage is supplied to the bit line BL in the cell connected in series, the voltage is divided according to each resistance of the transistor and the MTJ.

On the other hand, when using a transistor of which line width is below about 0.13 $\mu$m, the resistance of the transistor including channel resistance and contact resistance becomes larger. Therefore, the MTJ is provided with a relatively lower voltage, and it is difficult to detect a range of change in tunnel resistance because of the resistance from the transistor even if the tunnel resistance changes in accordance with spin arrangements of magnetic materials contained in the MTJ.

In case of using the transistor as a switching device, total resistance of the cell where the transistor and the MTJ are connected in series is $R_{MTJ}+R_{TR}$. Therefore, in case of a parallel spin arrangement, 'D0', $VCC/(R_{MTJ}^{para}+R_{TR})$ of currents are flowing to a sense amplifier if the bit line BL is provided with VCC. Also, in case of an anti-parallel spin arrangement, 'D1', $VCC/(R_{MTJ}^{anti}+R_{TR})$ of currents are flowing to the sense amplifier. The difference between those two currents is $VCC\{1/(R_{MTJ}^{para}+R_{TR})-1/(R_{MTJ}^{anti}+R_{TR})\}$.

When the VCC, $R_{TR}$, $R_{MTJ}^{para}$ and $R_{MTJ}^{anti}$ are assumed to be typically known values, which are, about 0.5 V, about 50 k$\Omega$, about 6 k$\Omega$ and about 10 k$\Omega$, respectively, total currents flowing to the sense amplifier is approximately 8.3 $\mu$A and a difference in currents between the 'D1' and the 'D0' is approximately 0.5 $\mu$A. A conventional sense amplifier has the current difference above about 10 $\mu$A, and requires a total current comparative value greater than about 5%. Hence, the current difference is lower than 10 $\mu$A in the conventional technology wherein the transistor and the MTJ are connected in series. This current difference takes up about 6% of the total current, representing a minimum threshold value with a consideration of sense margins.

Accordingly, the sense amplifier has a difficulty in distinguishing the 'D1' and 'D0' with this level of the current difference.

SUMMARY OF THE INVENTION

It is, therefore, an object of the present invention to provide a magnetic random access memory (MRAM) cell device capable of obtaining sense margins sufficient to detect changes in currents due to resistance of a magnetic tunnel junction (MTJ).

In accordance with an aspect of the present invention, there is provided a magnetic random access memory (MRAM) cell device, including: a word line; a bit line; a switching unit connected to the word line and the bit line; a magnetic tunnel junction unit connected to the bit line and the switching unit in parallel.

Also, the switching unit has a first end terminal connected to the word line, a second end terminal connected to a ground terminal and a third end terminal connected to the bit line, and the magnetic junction unit has a first end terminal connected to the ground terminal along with the second end terminal of the switching unit and a second end terminal connected to the bit line along with the third end terminal of the switching unit.

Particularly, the magnetic tunnel junction unit includes: a fixed magnetic layer of which magnetization direction is fixed; a freely switchable magnetic layer of which magnetization direction is changed in a parallel or an anti-parallel direction to the magnetization direction of the fixed magnetic layer; and a dielectric layer between the fixed magnetic layer and the freely switchable magnetic layer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Figure 1:
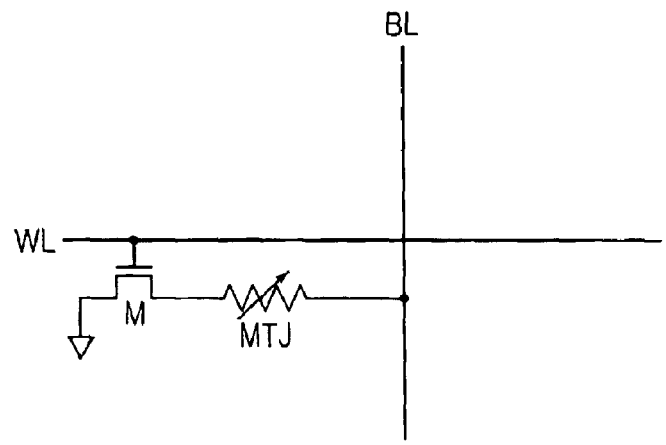
FIG. 1 is an equalizer circuit diagram showing a magnetic random access memory (MRAM) cell device in accordance with a prior art.
Figure 2:
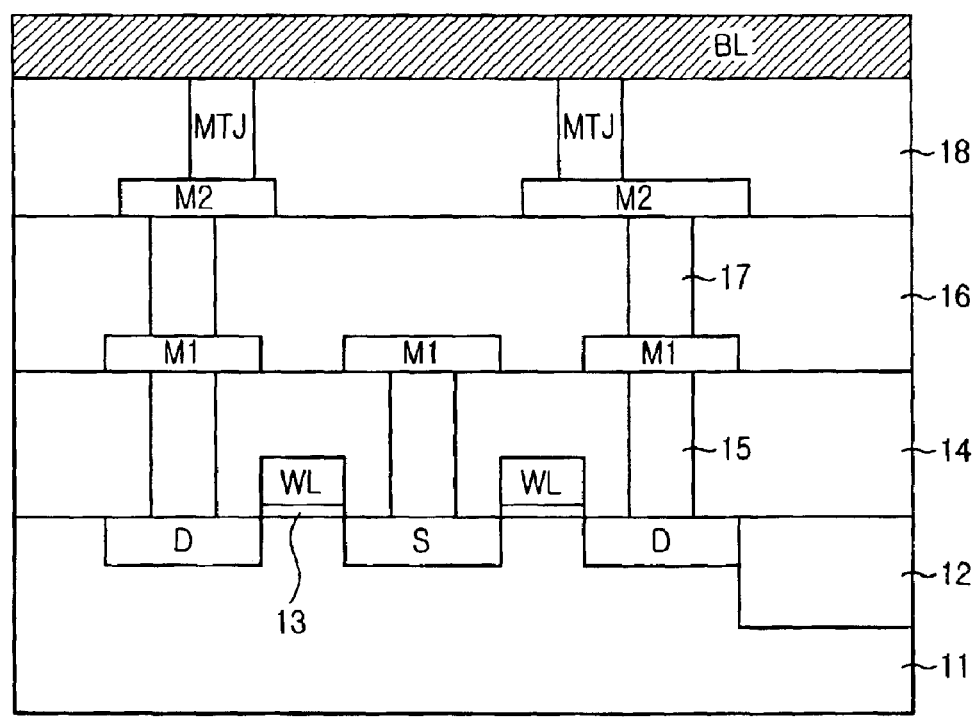
FIG. 2 is a cross-sectional view of the MRAM cell device in accordance with the prior art.
Figure 3:
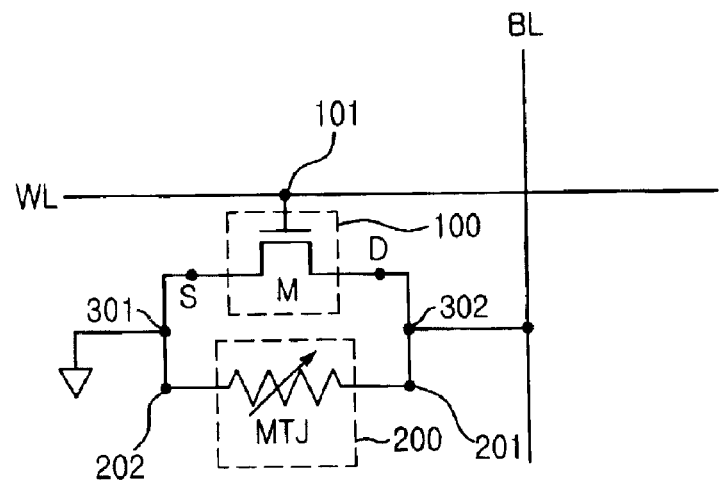
FIG. 3 is an equalizer circuit diagram showing a MRAM cell device in accordance with the present invention.

FIG. 3 is an equalizer circuit diagram showing a magnetic random access memory (MRAM) cell device in accordance with the present invention.

Referring to FIG. 3, a unit cell of the MRAM cell includes a transistor 100 for selecting the unit cell and a magnetic tunnel junction (MTJ) 200 for storing data. Especially, the transistor 100 and the MTJ 200 are connected in parallel at an area where a word line WL and a bit lien BL are crossing to each other.

Because of the parallel connection between the transistor 100 and the MTJ 200, there exist common connection nodes. Among those nodes, a first common connection node 301 is connected to a ground terminal, whereas a second common connection node 302 is connected to the bit line BL.

Meanwhile, the transistor 100 has an input terminal 101 for performing selectively on/off operations. The input terminal 101 is connected with the word line WL. Herein, the word line WL is supplied with VPP, while the bit line BL is supplied with the VCC.

The above transistor 100 is a switching device having a characteristic of on/off operations for selecting the MRAM cell, and a diode can be used as the switching device in addition to the transistor. The MTJ 200 can have a known structure, e.g., a structure including a magnetic material existing both terminals of a dielectric body.

Accordingly, in case of using the transistor 100 as the switching device, a drain D of the transistor 100 and a first end terminal 201 of the MTJ 200 are connected to each other, while a source S of the transistor 100 is connected to a second end terminal 202 of the MTJ 200. This structure is in a parallel connection.

Also, the source S of the transistor 100 and the second end terminal 202 of the MTJ 200 are connected to the ground terminal through the first common connection node 301. On the other hand, the drain D of the transistor 100 and the first end terminal 201 of the MTJ 200 are connected to the bit line BL through the second common connection node 302. A gate of the transistor 100 is connected to the word line WL.

In the MRAM cell device, the switching device has resistance ranging from about 1 k$\Omega$ to about 100 k$\Omega$, and the MTJ has resistance ranging from about 1 k$\Omega$ to about 20 k$\Omega$.

Figure 4A:
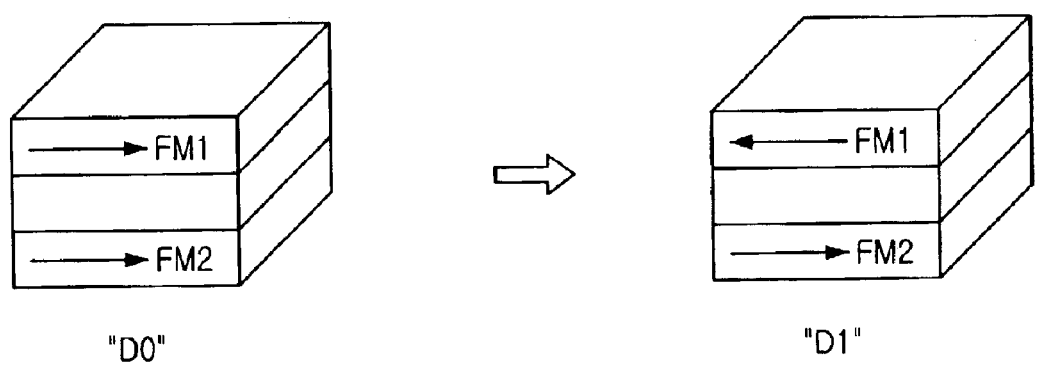
FIG. 4A is a diagram expressing a state of a magnetic tunnel junction (MTJ) when proceeding a writing operation of the MRAM cell device in accordance with the present invention.
Figure 4B:
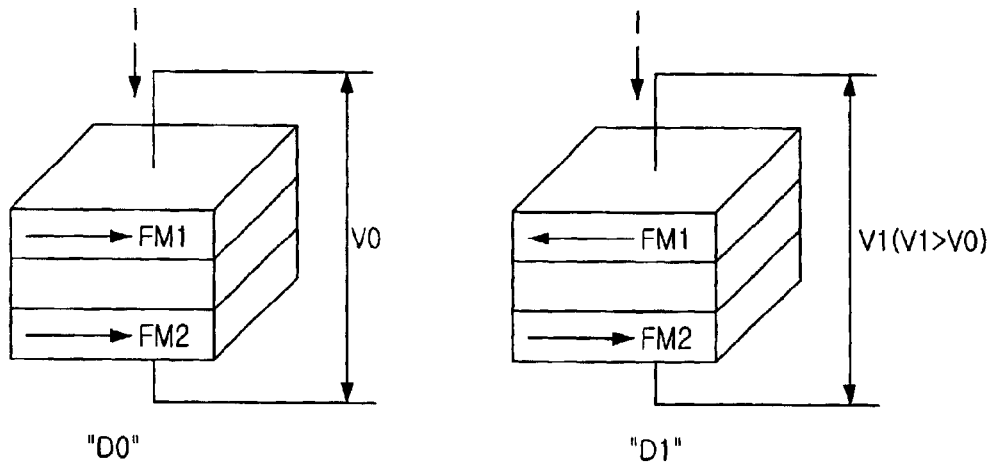
FIG. 4B is a diagram expressing a state of the MTJ when proceeding a reading operation of the MRAM cell device in accordance with the present invention.

With reference to FIGS. 4A and 4B, an operational method of the MRAM cell device will be described in detail.

For instance, the MTJ has a structure including a fixed magnetic layer FM2, a freely switchable magnetic layer FM1 and a dielectric layer allocated in between the fixed magnetic layer FM2 and the freely switchable magnetic layer FM1. Herein, the fixed magnetic layer FM2 has a fixed magnetization direction, whereas the freely switchable magnetic layer FM1 has a magnetization direction that is flexibly changeable in a parallel or an anti-parallel direction to the magnetization direction of the fixed magnetic layer FM2. Although it is not illustrated in FIGS. 4A and 4B, the fixed magnetic layer FM2 is constructed with a antiferromagnetic layer and a switchable ferromagnetic layer for fixing a magnetization direction of the magnetic layer. The antiferromagnetic magnetic layer is formed with any one material selected from a group consisting of MnFe, MnIr, PtMn, and MnRh. The fixed magnetic layer includes synthetic antiferromagnetic (SAF) layer of CoFe/Ru/CoFe. The synthetic antiferromagnetic layer has unsymmetric thickness. The switchable ferromagnetic layer is formed with any one material selected from a group consisting of Co, Fe, CoFe, NiFe.

Also, the dielectric layer uses $Al_2O_3$ of which compositional ratio is modified from the original $Al_2O_3$. The MARM device of the present invention can adopt current sensing scheme of CPP(current perpendicular plane) method with a tunnel barrier having improved smoothness to increase neil coupling effect. The MARM device of the present invention can adopt a current in plane(CIP) method for a convenience of integration. FIG. 4A is a diagram for describing a writing operation of the MRAM cell device, and FIG. 4B is a diagram for explaining a reading operation of the MRAM cell device.

As shown in FIG. 4A, the writing operation of the MRAM cell device switches only the magnetization direction of the freely switchable magnetic layer FM1 while fixing that of the fixed magnetic layer. Thus, the metal layers, e.g., a metal line and a bit line, are placed closely to the MTJ, and currents are flowed to generate magnetic fields necessary for a switching operation.

Referring to FIG. 4B, the reading operation starts with reading a voltage put to the MTJ when a consistent level of currents are flowing and a magnitude of the voltage is then classified into 'D0' and 'D1' by a sense amplifier. Alternatively, a magnitude of currents flowing through the MTJ can be classified into 'D0' and 'D1' by a sense amplifier while a consistent level of voltages are supplied.

For example, in the writing operation, binary information is stored through a switching operation from 'D0' to 'D1'. Herein, the 'D1' represents a case that the freely switchable magnetic layer FM1 has the magnetization direction parallel to the magnetization direction of the fixed magnetic layer FM2 within the MTJ due to a magnetic field externally supplied.

The binary information stored in the MRAM cell device through the writing operation is proceeded with a subsequent reading operation by supplying a certain level of an electric potential difference between V0 and V1 to the metal layers so as to set tunnel current I to be flowing through the dielectric layer and the freely switchable magnetic layer FM1. Herein, the V1 is greater than the V0. That is, electric resistance of the dielectric layer changes according to each magnetization states, i.e., a parallel 'D0' and an anti-magnetization direction 'D1' of the freely switchable magnetic layer FM1 with respect to the magnetization direction of the fixed magnetic layer FM2. Thus, it is possible to read the stored binary information by detecting the tunnel current changes.

Figure 5:
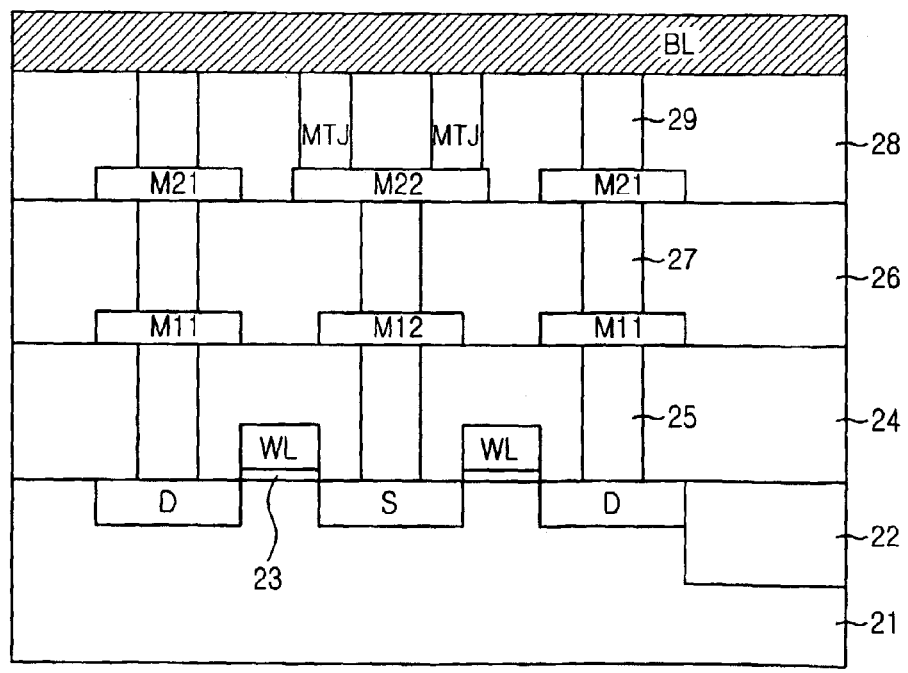
FIG. 5 is a cross-sectional view of the MRAM cell device in accordance with the present invention.

FIG. 5 is a cross-sectional view showing a magnetic random access memory (MRAM) cell device in accordance with a preferred embodiment of the present invention.

Referring to FIG. 5, a transistor including a word line WL layered with a gate oxide layer 23, a source S and a drain D is formed on a substrate 21 providing an isolation layer 22.

The source S and the drain D of the transistor are individually connected to each designated first metal line M11 and M12 through a contact 25 that passes through a first inter-layer insulating layer 24. The first metal line M11 connected to the drain D is perpendicularly connected to a second metal line M21 through a via 27 that passes through a second inter-layer insulating layer 26 covering the first metal line M11. On the other hand, the first metal line M12 connected to the source S is a ground terminal.

The second metal line M21 is eventually connected to the drain D due to its connection to the first metal line M11 through the via 27. Also, another second metal line M22 is connected to the first metal line M12 enacting as the ground terminal through the via 27.

Herein, the second metal line M21 and M22 are identical to the first and the second common connection nodes described in FIG. 3. Hence, hereinafter, the second metal line M22 and M11 are expressed as the first common connection node and the second common connection node, respectively.

Next, a third inter-layer insulating layer 28 covers the first common connection node M22 and the second common connection node M21. Then, a bit line BL connected to the second common connection node M21 through a bit line contact 29 that passes through the third inter-layer insulating layer 28 is formed on the third inter-layer insulating layer 28 in a cross-direction to the word line WL.

A magnetic tunnel junction (MTJ) is formed between the bit lien BL and the first common connection node M22. That is, one end terminal of the MTJ is connected to the bit line BL, while another end terminal of the MTJ is connected to the first common connection node M21.

The following will describe a method for driving the MRAM cell device when constructing arrays of a number of the MRAM cells illustrated in FIGS. 4 to 5.

The bit line BL is connected to a sense amplifier (not shown). Any one MTJ can be identified by selecting a predetermined number of word lines WL and a predetermined number of bit lines BL. After completing the writing operation of the information provided from each of the MTJ, flowing tunnel currents are detected from the word line WL connected to the MTJ and the bit line BL so as to retrieve the stored information from the MTJ.

For instance, in case of the parallel spins of the magnetization direction, 'D0', the transistor and the MTJ are flowed with $VCC/R_{TR}$ and $VCC/R_{MTJ}^{para}$ of currents, respectively when the bit line has VCC. Therefore, the total current flowing to the sense amplifier is then $VCC(1/R_{TR}+1/R_{MTJ}^{para})$.

In addition, in case of the anti-parallel spins, 'D1', $VCC/R_{TR}$ and $VCC/R_{MTJ}^{anti}$ of the currents are flowing to the transistor and the MTJ, respectively. Therefore, the total current flowing to the sense amplifier is $VCC/(1/R_{TR}+1/R_{MTJ}^{anti})$.

The difference between the total currents is $VCC(1/R_{MTJ}^{para}-1/R_{MTJ}^{anti})$.

Assuming that the VCC, $R_{TR}$, $R_{MTJ}^{para}$ and $R_{MTJ}^{anti}$ have typically known values, which are about 0.5 V, 50 kΩ, 6 kΩ and 10 kΩ, respectively, a difference between the total currents flowing to the sense amplifier is approximately 33 µA, and this difference corresponds to about 40% of an overall current comparative value.

This difference also satisfies conditions required by a typical sense amplifier by being greater than about 10 µA and about 5% of the overall current comparative value. Therefore, it is possible to detect sufficiently the 'D0' and the 'D1' with this attained current difference. Accordingly, it is further possible to obtain sufficient sense margins by connecting the transistor and the MTJ in parallel.

The MRAM cell device described in the above preferred embodiment of the present invention can applied to all MRAM devices realizing the data writing and reading mechanisms by using a characteristic of resistance provided from the magnetic layer; particularly, to those MRAM devices having a sensing specification of which external current deviation is higher than about 5% due to resistance changes during the data reading operation.

Also, the MRAM cell device provided from the present invention can be applicable to any MRAM device employed for obtaining sufficient sense margins through a current and voltage divisional method with use of parallel resistance.

Accordingly, the present invention provides an advantage of detecting a pair of magnetization spins in a parallel direction 'D0' or in an anti-parallel direction 'D1' even when using the typical sense amplifier by increasing a current difference between the 'D0' and the 'D1' through which a switching device including a transistor and a MTJ are connected in parallel.

While the present invention has been described with respect to certain preferred embodiments, it will be apparent to those skilled in the art that various changes and modifications may be made without departing from the scope of the invention as defined in the following claims.

What is claimed is:

1. A magnetic random access memory (MRAM) device having a plurality of memory cells, each memory cell comprising:
    a switching unit connected to a ground voltage, a word line and a bit line;
    a magnetic tunnel junction unit connected between the bit line and the ground voltage in parallel with the switching unit.

2. The MRAM device as recited in claim 1, wherein the switching unit has a first terminal connected to the word line, a second terminal connected to the ground voltage and a third terminal connected to the bit line, and the magnetic junction unit has a first terminal connected to the ground voltage and a second terminal connected to the bit line.

3. The MRAM device as recited in claim 2, wherein the switching unit is either a transistor or a diode.

4. The MRAM device as recited claim 2, wherein the magnetic tunnel junction unit includes:
- a fixed magnetic layer of which magnetization direction is fixed;
- a freely switchable magnetic layer of which magnetization direction is changed in a parallel or an anti-parallel direction to the magnetization direction of the fixed magnetic layer; and
- a dielectric layer between the fixed magnetic layer and the freely switchable magnetic layer.

5. The MRAM device as recited in claim 4, wherein the fixed magnetic layer is constructed with a an antiferromagnetic layer and a switchable ferromagnetic layer for fixing a magnetization direction of the magnetic layer.

6. The MRAM device as recited in claim 5, wherein the antiferromagnetic magnetic layer is formed with any one material selected from a group consisting of MnFe, MnIr, PtMn, and MnRh.

7. The MRAM device as recited in claim 5, wherein the fixed magnetic layer includes synthetic antiferromagnetic (SAF) layer of CoFe/Ru/CoFe.

8. The MRAM device as recited in claim 7, wherein the synthetic antiferromagnetic layer has unsymmetric thickness.

9. The MRAM device as recited in claim 5, wherein the switchable ferromagnetic layer is formed with any one material selected from a group consisting of Co, Fe, CoFe and NiFe.

10. The MRAM device as recited in claim 5, wherein the MARM adopts current sensing scheme of CPP (Current perpendicular plane) method.

11. The MRAM device as recited in claim 5, wherein the MARM adopts current sensing scheme of CIP (current in plane) method.

12. The MARM device as recited in claim 10, wherein the MARM further includes a tunnel barrier having improved smoothness.

13. The MRAM device as recited in claim 1, wherein the switching unit has a resistance value ranging from about 1 k$\Omega$ to about 100 K$\Omega$, and the magnetic tunnel junction unit has a resistance value ranging from about 1 k$\Omega$ to about 20 K$\Omega$.

14. A magnetic random access memory (MRAM) device having a plurality of memory cells, each memory cell comprising:
- a switching unit having a source, a gate and a drain which one connected to a ground voltage, a word line and a bit line, respectively;
- a magnetic tunnel junction unit having a first terminal and a second terminal which are connected to the bit line and the ground voltage, respectively, such that the magnetic tunnel junction is connected to the switching unit in parallel.

15. The MRAM device as recited claim 14, wherein the magnetic tunnel junction unit includes:
- a fixed magnetic layer of which magnetization direction is fixed;
- a freely switchable magnetic layer of which magnetization direction is changed in a parallel or an anti-parallel direction to the magnetization direction of the fixed magnetic layer; and
- a dielectric layer between the fixed magnetic layer and the freely switchable magnetic layer.

16. The MRAM device as recited in claim 15, wherein the fixed magnetic layer is constructed with an antiferromagnetic layer and a switchable ferromagnetic layer for fixing a magnetization direction of the magnetic layer.

17. The MRAM device as recited in claim 16, wherein the antiferromagnetic magnetic layer is formed with any one material selected from a group consisting of MnFe, MnIr, PtMn, and MnRh.

18. The MRAM device as recited in claim 16, wherein the fixed magnetic layer includes synthetic antiferromagnetic (SAF) layer of CoFe/Ru/CoFe.

19. The MRAM device as recited in claim 18, wherein the synthetic antiferromagnetic layer has unsymmetric thickness.

20. The MRAM device as recited in claim 16, wherein the switchable ferromagnetic layer is formed with any one material selected from a group consisting of Co, Fe, CoFe and NiFe.

* * * * *